United States Patent
Zhang

[11] Patent Number: 6,140,164
[45] Date of Patent: Oct. 31, 2000

[54] METHOD OF MANUFACTURING A SEMICONDUCTOR DEVICE

[75] Inventor: Hongyong Zhang, Kanagawa, Japan

[73] Assignee: Semiconductor Energy Laboratory Co., Ltd., Kanagawa-ken, Japan

[21] Appl. No.: 08/756,169

[22] Filed: Nov. 25, 1996

[30] Foreign Application Priority Data

Nov. 24, 1995 [JP] Japan ................................. 7-329761

[51] Int. Cl.[7] ................................................. H01L 21/84
[52] U.S. Cl. .......................... 438/163; 438/303; 438/305; 438/306
[58] Field of Search ...................... 438/301, 303, 438/305, 306, 163; 205/124

[56] References Cited

U.S. PATENT DOCUMENTS

| | | | |
|---|---|---|---|
| 5,561,075 | 10/1996 | Nakazawa | 438/30 |
| 5,576,231 | 11/1996 | Konuma | 438/151 |
| 5,620,905 | 4/1997 | Konuma | 438/163 |

FOREIGN PATENT DOCUMENTS

| | | |
|---|---|---|
| 3-38755 | 6/1991 | Japan . |
| 4-360580 | 12/1992 | Japan . |
| 5-166837 | 7/1993 | Japan . |

*Primary Examiner*—John Niebling
*Assistant Examiner*—Brendon Mee
*Attorney, Agent, or Firm*—Fish & Richardson P.C.

[57] ABSTRACT

A resist mask used for forming a region of aluminum is made small by ashing to form a new mask. Anodic oxidation is carried out with an anode of the region of aluminum to form porous anodic oxidation films. In this anodic oxidation step, the mask can control the directions of openings of the porous anodic oxidation films (anisotropy). If the impurity ions are implanted using the porous anodic oxidation films as masks, the amount of impurity ions implanted into an active layer can be adjusted. Using this, an LDD region can be formed.

9 Claims, 3 Drawing Sheets

METHOD OF MANUFACTURING A SEMICONDUCTOR DEVICE

BACKGROUND OF THE INVENTION

1. Field of the Invention

The present invention relates to a method of manufacturing a thin film transistor, and particularly to a method of manufacturing a thin film transistor having a low concentration impurity region represented by an LDD region.

2. Description of the Related Art

There is known a technique in which a thin film semiconductor formed on a glass substrate or a quartz substrate is used to make a thin film transistor. Such a thin film transistor is used in, for example, an active matrix type liquid crystal display device or an active matrix type EL display device.

As a technical problem involved in such a thin film transistor, there is given that an OFF-state current value is large. The OFF-state current is a current flowing from or to an output side when the thin film transistor is in an OFF-state operation.

For example, in the active matrix type liquid crystal display device, a pixel electrode is required to have a characteristic of keeping electric charges for a predetermined time. Thus, a value of a current flowing through an element in an OFF-state operation, that is, a value of an OFF-state current is required to be made as small as possible.

As a technique for lowering an OFF-state current value of a thin film transistor, there is known a technique disclosed in Japanese Examined Patent Publication No. Hei 3-38755. Further, as structures capable of obtaining an effect similar to the above technique, there are known techniques disclosed in Japanese Patent Unexamined Publication Nos. Hei 4-360580 and Hei 5-166837.

The techniques disclosed in the latter two publications are methods in which an offset gate region is formed in a self-alignment manner by using an anodic oxidation film formed around a gate electrode. This method is capable of forming the offset gate region with high precision without complicating manufacturing steps so much.

However, in the techniques disclosed in Japanese Patent Unexamined Publication Nos. Hei 4-360580 and Hei 5-166837, an LDD (lightly doped drain) region, which is one of the optimum structures to obtain a low OFF-state current characteristic, can not be formed in a self-alignment manner.

SUMMARY OF THE INVENTION

An object of the present invention is to provide a technique capable of forming an LDD region in a self-alignment manner.

According to one aspect of the present invention, a method of manufacturing a semiconductor device which comprises implanting impurity ions using porous anodic oxidation films as a mask, and is characterized in that the anodic oxidation film has anisotropy in selectively different directions, and the amount of impurity ions passing through the mask differs in accordance with the different anisotropies.

More specifically, impurity ions are implanted using as a mask anodic oxidation film including a portion with anisotropy mainly in a vertical direction and a portion with anisotropy mainly in a horizontal direction, so that the impurity ions with different concentrations may be selectively implanted into low concentration impurity regions.

The present invention uses the features that by providing anodic oxidation film with partly different anisotropies, the amount (defined by the number of ions passing through a unit area) of impurity ions passing through the film differs in accordance with the anisotropies.

Here, a film with anisotropy in the vertical direction means that the film is porous and has a-number of (a majority of) openings extending in the vertical direction. Also, a film with anisotropy in the horizontal direction means that the film is porous and has a number of (a majority of) openings extending in the horizontal direction.

According to another aspect of the present invention, a method of manufacturing a semiconductor device having a gate insulating film formed on an active layer, and a gate electrode formed on the gate insulating film and made of a material enabling anodic oxidation, is characterized by comprising the steps of forming porous anodic oxidation films with different anisotropies around the gate electrode, and implanting impurity ions using the porous anodic oxidation films as masks to selectively implant the impurity ions into the active layer in accordance with the different anisotropies.

According to still another aspect of the present invention, a method of manufacturing a semiconductor device comprising an active layer, a gate insulating film formed on the active layer, and a gate electrode formed on the gate insulating film and made of a material enabling anodic oxidation, is characterized by comprising the steps of forming porous anodic oxidation films having different anisotropies on the side surfaces of the gate electrode, and implanting impurity ions to impart one conductivity into the active layer using the anodic oxidation films as masks, so that a channel-forming region is formed in the active layer corresponding to the gate electrode, low concentration impurity regions are formed in the active layer corresponding to the porous anodic oxidation films, and a pair of high impurity concentration regions functioning as source and drain regions are formed adjacently to the low concentration impurity regions.

In order to realize the above described structure, it is important to make the shape of a resist mask small used at patterning the gate electrode (accurately an island-like region as a starting material of the gate electrode) by ashing treatment.

In this way, at the formation of the porous anodic oxidation films, film quality with a number of openings extending in the vertical direction and film quality with a number of openings extending in the horizontal direction can be obtained at the same time.

DETAILED DESCRIPTION OF THE INVENTION

[Embodiment 1]

FIGS. 1(A) to 1(D) show manufacturing steps according to an embodiment of the invention. In this embodiment, an N-channel type thin film transistor in which an LDD (lightly doped drain) region is formed in a self-alignment manner on a glass substrate, is manufactured.

Figure 1A:
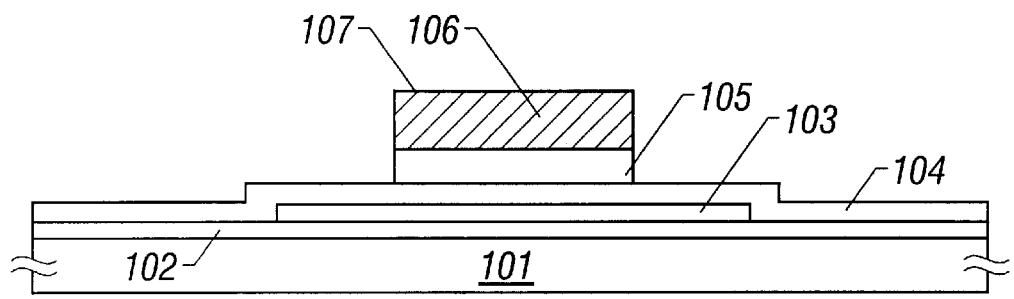
FIGS. 1(A) to 1(D) are views showing manufacturing steps of a thin film transistor according to an embodiment of the present invention.

As shown in FIG. 1(A), a silicon oxide film with a thickness of 3000 Å is formed as an under film 102 on a glass substrate 101 by the sputtering method or the plasma CVD method. As the glass substrate 101, Corning 7059 glass substrate or Corning 1737 glass substrate may be used.

After forming the under film 102, an amorphous silicon film (not shown) is formed by the plasma CVD method or the low pressure thermal CVD method. The thickness of the amorphous film is 500 Å.

Next, the amorphous silicon film (not shown) is patterned to form an active layer 103 of a thin film transistor.

After forming the active layer 103, a silicon oxide film 104 is formed as a gate insulating film by the plasma CVD method. The thickness of the silicon oxide film 104 constituting the gate insulating film is 1000 Å.

Next, an aluminum film 105 with a thickness of 4000 Å (not shown) which will become afterward a gate electrode is formed by the sputtering method. 0.1 wt. % Scandium is contained in the aluminum film.

The scandium is contained to prevent hillocks or whiskers from being produced by abnormal growth of aluminum in subsequent steps.

The hillocks and whiskers are needle-like or splinter-like protrusions of aluminum which may cause a short circuit with separate wirings or electrodes.

After forming the aluminum film (not shown), an extremely thin anodic oxidation film 106 is formed on the surface of the aluminum film by an anodic oxidation step. In this step, a solution of an ethylene glycol solution containing 3% tartaric acid neutralized by ammonia water is used as an electrolytic solution. The anodic oxidation is carried out in the electrolytic solution using the aluminum film as an anode.

The anodic oxidation is carried out under the conditions that a cathode is platinum, a forming current is 5 mA, and an attained voltage is 10 V. The thickness of the anodic oxidation film is about 100 Å. The film thickness can be controlled by the attained voltage.

The anodic oxidation film has the function of improving the adhesion of a resist mask to be formed subsequently. The anodic oxidation film formed in this step has dense and firm film qualities.

Next, a resist mask 107 is formed on the aluminum film (not shown), and pattering is carried out. In this way, the pattern as the original form of a gate electrode is formed (FIG. 1(A)).

Figure 1B:
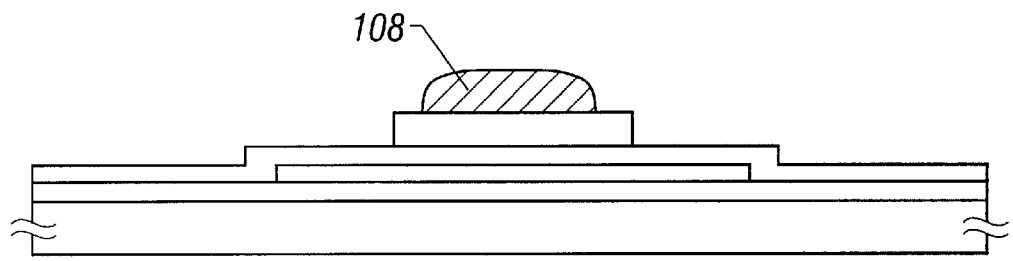

After the aluminum film (not-shown) is patterned to obtain the state as shown in FIG. 1(A), ashing by oxygen plasma is carried out to etch the resist mask 107. By carrying out the ashing step, the resist mask 108 becomes the state as shown in FIG. 1(B).

That is, the corner portions of the resist mask are scraped, so that the surface area thereof becomes small.

The method of using the ashing does not particularly require a mask so that it becomes useful in a process. Incidentally, a mask may be used to further pattern the resist mask into a desired shape.

In this state, the anodic oxidation is again carried out. In this anodic oxidation, 3% oxalic acid solution (PH=2) is used as an electrolytic solution. The anodic oxidation is carried out in the electrolytic solution with the residual aluminum film as an anode.

This anodic oxidation is carried out under the conditions that platinum is used as a cathode and an attained voltage is set to 8 V. The thickness of the anodic oxidation film is 6,000 Å. In this anodic oxidation step, the film thickness of the anodic oxidation film can be controlled by the time of anodic oxidation.

In this anodic oxidation step, the anodic oxidation proceeds first at portions designated by 109 and 110, and subsequently proceeds at portions designated by 111 and 112.

In the anodic oxidation proceeding at the portions 109 and 110, since the resist mask 108 does not exist on the top thereof, the portions have such film qualities as porosity and anisotropy in the direction vertical to the substrate. That is, there are obtained such film qualities that there are many openings extending mainly in the direction vertical to the substrate.

On the other hand, in the portions designated by 111 and 112, there is formed an anodic oxidation film having such film qualities as porosity and anisotropy in the direction parallel to the substrate, from the side surfaces of the residual aluminum film 105. That is, in these regions, such film qualities are obtained that there are many openings extending mainly in the direction parallel to the substrate.

The state of the film qualities of these porous anodic oxidation films can be confirmed by observation through an electron microscope. At the tip end of the growth of the porous anodic oxidation film (where the film is brought into contact with aluminum), an extremely thin and dense anodic oxidation film can be observed.

Figure 1C:
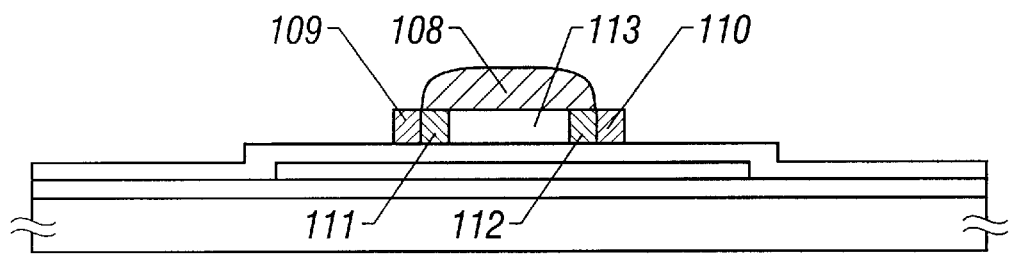

A residual portion 113 becomes a gate electrode (FIG. 1(C)).

After obtaining the state as shown in FIG. 1(C), the resist mask 108 is removed by an exclusive parting liquid. Further, the extremely thin and dense anodic oxidation film 106 is removed.

Then, the third anodic oxidation is carried out. This anodic oxidation is carried out similarly to the first anodic oxidation, using an electrolytic solution of ethylene glycol solution containing 3% tartaric acid neutralized by ammonia water.

This step is carried out under the same conditions as those in which the first dense anodic oxidation film 106 was formed. However, an attained voltage is made high so that the thickness of the anodic oxidation film to be formed is set to 500 Å.

In this anodic oxidation step, the electrolytic solution intrudes into the inside of the anodic oxidation films 109, 110, 111 and 112. Accordingly, an anodic oxidation film 114 is formed so as to cover the surface of the gate electrode 113 as shown in the FIG. 1(D).

Figure 1D:
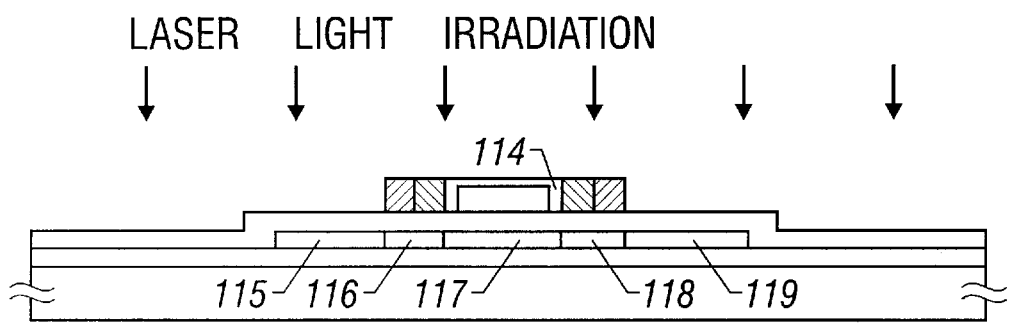

Then, the state as shown in FIG. 1(D) is obtained. In this state, impurity ions are implanted. Here, in order to manufacture an N-channel type thin film transistor, P (phosphorus) ion implantation is carried out by the plasma doping method.

The P ion implantation is carried out under the dose amount of 0.2 to $5\times10^{15}/cm^2$, preferably 1 to $2\times10^{15}/cm^2$. In this step, P ions are not directly implanted into the active layer 103 just under the anodic oxidation films designated by 111 and 112.

On the other hand, P ions are implanted into the active layer 103 just under the anodic oxidation films designated by 109 and 110 due to the properties of the anodic oxidation films 109 and 110.

That is, since the anodic oxidation films 109 and 110 include a number of openings extending in the vertical direction, a part of accelerated and implanted P ions is implanted into the active layer through the openings.

Figure 2:
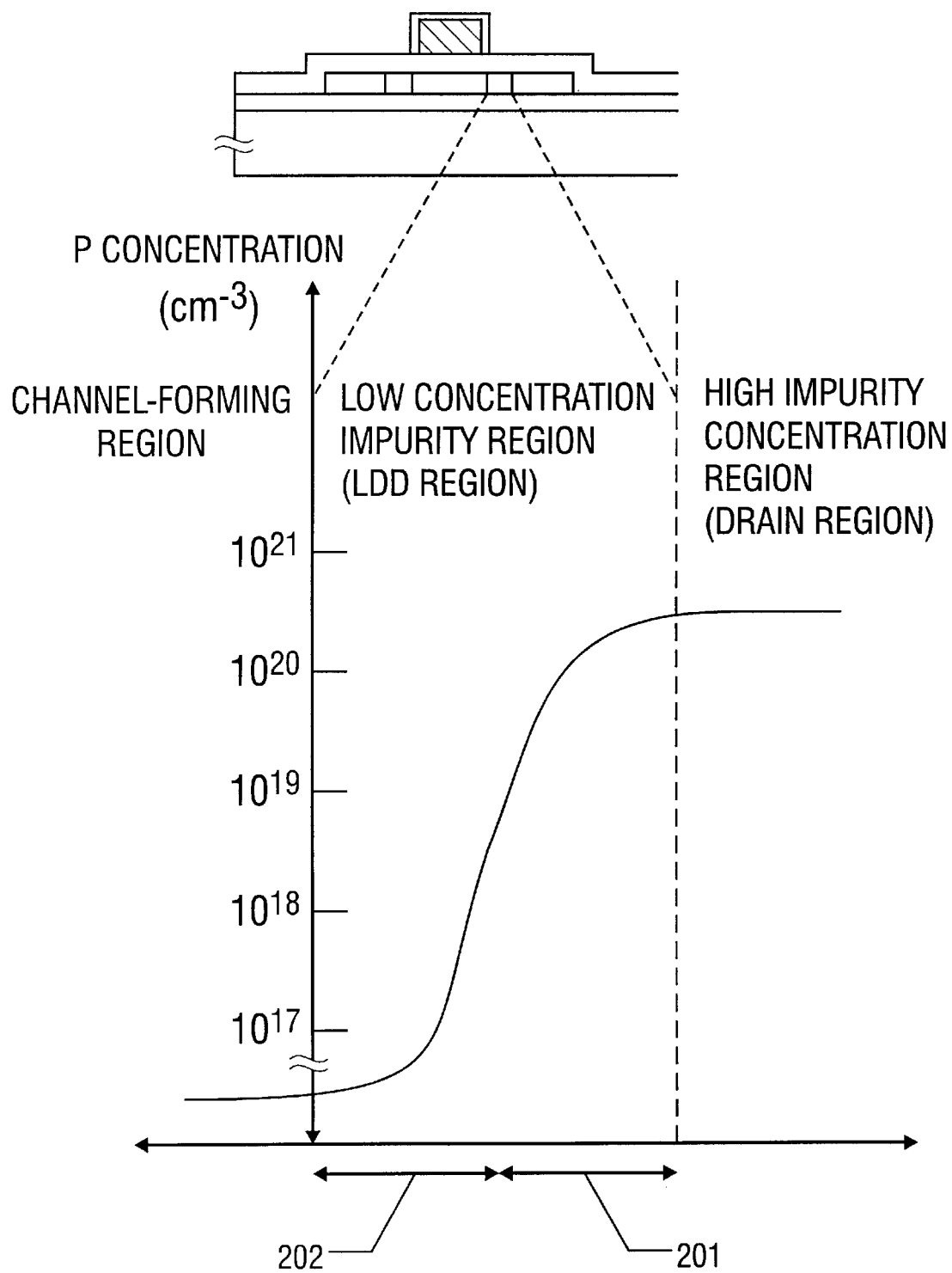
FIG. 2 is a view showing a distribution of P (phosphor) concentration in a low concentration impurity region.

As a result that the impurity ions are implanted in such a manner, the distribution of the concentration of P elements in the region designated by 118 is, for example, as shown in FIG. 2. FIG. 2 shows an example, and the state of distribution of the concentration of P ions can be changed through conditions of impurity ion implantation or the like.

The reason why the distribution of the concentration of P ions becomes such a state as shown in FIG. 2 is as follows. First, in a region 201 (see FIG. 2) just under the region where porous anodic oxidation films 109 and 110 existed, there exist P ions implanted through the openings of the anodic oxidation film 110 and P ions coming from the circumference of the region.

Accordingly, P elements exist in the distribution as shown in FIG. 2.

On the other hand, in a region 202 (see FIG. 2) just under the region where porous anodic oxidation film 112 existed, since P ions are basically blocked by the anodic oxidation film 112, there exist no P ions directly implanted through the anodic oxidation film.

However, since ions come from the circumference of the region, the concentration of P ions at a position in the region 202 becomes high as the position becomes close to the border to the region 201.

In this way, there exist P elements implanted in the distribution as shown in FIG. 2. FIG. 2 shows the state in which a low concentration impurity region 118 referred to as an LDD (lightly doped drain) region is formed between a channel-forming region 117 and a drain region 119 of a high concentration impurity region.

Incidentally, the ions come from the circumference because the gate insulating film around the region is charged in a positive potential with respect to the gate electrode as the positive ions are implanted.

In this way, by using the difference in the film qualities of the porous anodic oxidation films designated by 109, 110, 111, and 112 in FIG. 1(C), selectively implantation of impurity ions can be carried out.

In this embodiment, although P ions are implanted, similar effects can be obtained for other impurity ions, for example, B ions.

After the impurity ions are implanted, the porous anodic oxidation films 109 to 112 (see FIG. 1(C)) are removed by using a mixed acid of phosphoric acid, acetic acid, and nitric acid.

Figure 3A:
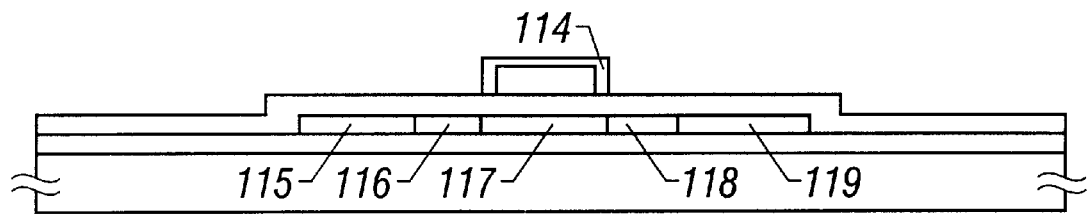
FIGS. 3(A) to 3(C) are views showing manufacturing steps of a thin film transistor according to an embodiment of the present invention.

In this way, the state as shown in FIG. 3(A) is obtained. In this state, irradiation of a laser beam is carried out to anneal the regions where the impurity ions were implanted in the previous step. This annealing may be carried out by the irradiation of ultraviolet rays or infrared rays. Further, heating may be used concurrently with the laser beam irradiation.

In the state as shown in FIG. 3(A), since the annealing by the laser beam irradiation can also be carried out for the regions into which the impurity ions come from the circumference, the damage of the active layer due to the impurity ion implantation can be almost completely annealed.

Then, an interlayer insulating film 120 is formed. The interlayer insulating film 120 may be formed of a silicon oxide film, a silicon nitride film, a laminated film of the silicon oxide film and silicon nitride film, a laminated film of the silicon oxide film and resin material, or a laminated film of the silicon nitride film and the resin material. In this embodiment, a silicon oxide film with a thickness of 5000 Å formed by the plasma CVD method is used as the interlayer insulating film 120.

Figure 3B:
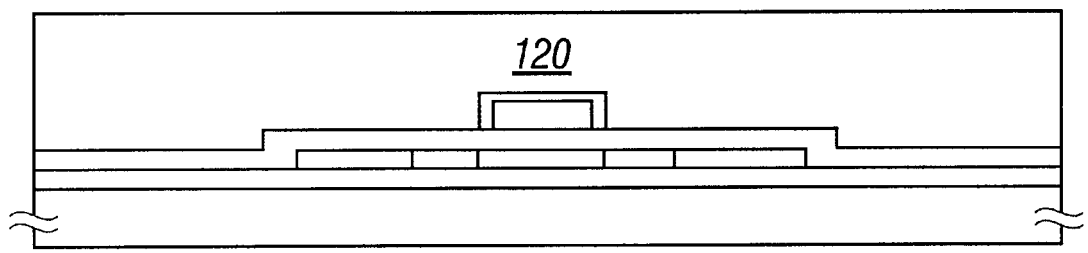

In this way, the state as shown in FIG. 3(B) is obtained. Next, contact holes are formed, and a source electrode 121 and a drain electrode 122 are formed. At last, heat treatment for an hour in a hydrogen atmosphere of 350° C. is carried out to complete a thin film transistor as shown in FIG. 3(C).

Figure 3C:
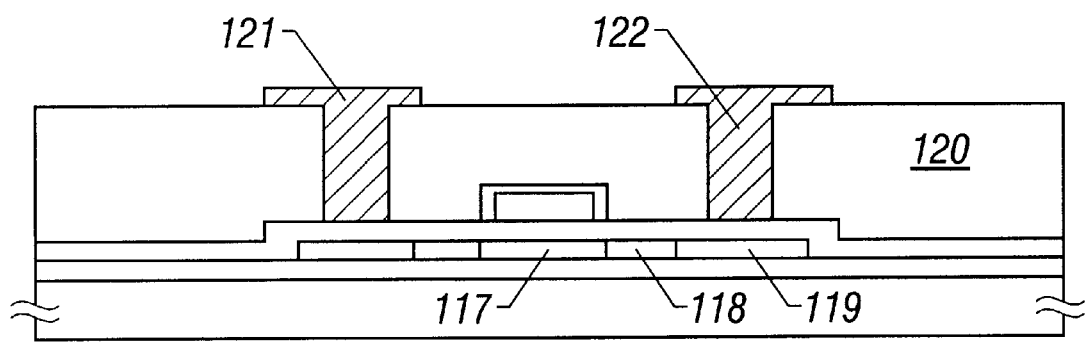

The thin film transistor as shown in FIG. 3(C) includes the LDD region 118 formed in a self-alignment manner between the channel-forming region 117 and the drain region 119. The LDD region can be obtained in such a structure that the concentration of P elements becomes high from the channel-forming region 117 to the drain region 119 stepwise or continuously.

In this structure, since there is no region where the concentration of the impurity elements to impart one conductivity is abruptly changed, it is possible to suppress the formation of a local high electric field.

As disclosed in Japanese Examined Patent Publication No. Hei 3-38755, the existence of an OFF-state current is caused by the formation of the local high electric field and movement of carriers through trap levels in accordance with the electric field.

Accordingly, the structure according to the present embodiment in which the formation of the local high electric field can be prevented, is useful as a structure to lower an OFF-state current value.

Further, in case of an N-channel type thin film transistor, particularly, the existence of the local high electric field causes deterioration of the characteristics due to hot carriers. However, in the structure shown in this embodiment, it is possible to suppress the problem of deterioration due to the hot carriers.

[Embodiment 2]

In this embodiment, the film thickness of the anodic oxidation film around the gate electrode 113 formed in the step of FIG. 1(D) is set to 1,500 Å. With this structure, the region of the active layer just under the anodic oxidation film can function as an offset gate region.

In the structure of embodiment 1 shown in FIG. 1(D), since the thickness of the anodic oxidation film 114 is thin as being 500 Å, the existence of the offset region can be practically neglected.

However, as in this embodiment, when the thickness of the anodic oxidation film 114 is made thick, it becomes impossible to neglect the region, which does not function as a channel formed in the active layer just under the film, or as source/drain.

This region is referred to as an offset gate region, which is formed between the channel-forming region and the source region/drain region and serves to relax electric field intensity. In this sense, it has a function similar to that of the LDD region.

In the step as shown in FIG. 1(D), the dense anodic oxidation film with a thickness of 1,500 Å can be obtained when an attained voltage at the anodic oxidation is made 100 V. When the attained voltage is set close to 300 V, the anodic oxidation film with a thickness of about 2,500 Å can be grown. However, reproducibility of the step becomes unstable, and also the danger of the operation increases.

[Embodiment 3]

In this embodiment, the anodic oxidation film having the dense film quality designated by 106 in FIG. 1(A) in the structure shown in embodiment 1, is not formed.

In the case where the anodic oxidation film 106 is not formed, in order to increase the adhesiveness of a resist mask, there are required some ideas, for example, to activate the surface of an aluminum film by irradiation of ultraviolet rays onto the surface.

In the case where the anodic oxidation film is not formed, the anisotropy of the porous anodic oxidation films 109 and 110 becomes more remarkable in the vertical direction. That is, the state in which there are openings extending in the vertical direction becomes more noticeable.

Thus, impurity ions of higher concentration can be implanted into the active layer just under the anodic oxidation films 109 and 110.

As described above, according to the present invention, the porous anodic oxidation films having different anisotropies are formed on the side surfaces of the gate electrode made of a material enabling the anodic oxidation, and implantation of impurity ions to impart one conductivity is carried out in the state where the porous anodic oxidation films exist, so that the concentration of the impurity ions into the active layer can be selectively controlled.

Then, the LDD region can be formed in a self-alignment manner.

Further, since the implantation of the impurity ions can be carried out in a self-alignment manner, it becomes useful in the processing steps.

The thus obtained thin film transistor can be made in such a structure that a high electric field is not formed locally at and near the border between the channel-forming region and the drain region. Then, the thin film transistor having low OFF-state current characteristics can be obtained.

What is claimed is:

1. A method of manufacturing a semiconductor device, comprising implanting impurity ions using porous anodic oxidation film as a mask, wherein said anodic oxidation film has anisotropy in selectively different directions, and the amount of impurity ions passing through said mask differs in accordance with said different anisotropies.

2. A method of manufacturing a semiconductor device which comprises a gate insulating film formed on an active layer, and a gate electrode formed on said gate insulating film and made of a material enabling anodic oxidation, said method comprising the steps of:

forming porous anodic oxidation films having different anisotropies around the gate electrode; and implanting impurity ions using said porous anodic oxidation films as masks to selectively implant said impurity ions into the active layer in accordance with said different anisotropies.

3. The method of claim 2, wherein the material enabling the anodic oxidation is aluminum or a material essentially consisting of aluminum.

4. The method of claim 2, wherein the porous anodic oxidation films adjacent to the gate electrode include a number of openings extending in a horizontal direction.

5. A method of manufacturing a semiconductor device which comprises an active layer, a gate insulating film formed on said active layer, and a gate electrode formed on said gate insulating film and made of a material enabling anodic oxidation, said method comprising the steps of:

forming porous anodic oxidation films having different anisotropies at side surfaces of the gate electrode; and implanting impurity ions to impart one conductivity using said porous anodic oxidation films as masks into the active layer in accordance with the different anisotropies;

whereby a channel-forming region is formed in the active layer corresponding to said gate electrode;

low concentration impurity regions are formed in the active layer corresponding to said porous anodic oxidation films; and a pair of high concentration impurity regions functioning as source and drain regions are formed adjacently to said low concentration impurity region.

6. The method of claim 5, wherein aluminum is used as the material enabling the anodic oxidation.

7. The method of claim 5, further comprising the step of carrying out ashing of a resist mask used for forming the gate electrode to make a shape of the resist mask small, the porous anodic oxidation films being formed after the step of ashing.

8. The method of claim 5, the anodic oxidation film formed at a position corresponding to the low concentration impurity region at a side of the channel-forming region has a number of openings extending in a horizontal direction with respect to the active layer, and the anodic oxidation film formed at a position corresponding to the low concentration impurity region at a side of the source/drain regions has a number of openings extending in a vertical direction with respect to the active layer.

9. The method of claim 5, wherein an impurity concentration of the low concentration impurity region at a side of the channel-forming region is lower than an impurity concentration of the low concentration impurity region at a side of the drain region.

* * * * *